(12) United States Patent
Xiao

(10) Patent No.: US 9,530,977 B2
(45) Date of Patent: Dec. 27, 2016

(54) TUNNELING NANOTUBE FIELD EFFECT TRANSISTOR AND MANUFACTURING METHOD THEREOF

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 14/559,408

(22) Filed: Dec. 3, 2014

(65) Prior Publication Data

US 2015/0318504 A1 Nov. 5, 2015

(30) Foreign Application Priority Data

May 5, 2014 (CN) .......................... 2014 1 0185138

(51) Int. Cl.
*H01L 51/05* (2006.01)
*H01L 51/10* (2006.01)
*H01L 51/00* (2006.01)

(52) U.S. Cl.
CPC .......... *H01L 51/055* (2013.01); *H01L 51/002* (2013.01); *H01L 51/0002* (2013.01); *H01L 51/0021* (2013.01); *H01L 51/0558* (2013.01); *H01L 51/105* (2013.01); H01L 51/0048 (2013.01); H01L 51/0512 (2013.01)

(58) Field of Classification Search
CPC ......................... H01L 29/0673; H01L 51/0048
See application file for complete search history.

(56) References Cited

U.S. PATENT DOCUMENTS

| | | | | |
|---|---|---|---|---|
| 4,638,347 A * | 1/1987 | Iyer | ..................... | H01L 29/4983 257/384 |
| 7,141,727 B1 * | 11/2006 | Appenzeller | .......... | B82Y 10/00 257/20 |
| 7,714,386 B2 * | 5/2010 | Pesetski et al. | .............. | 257/347 |
| 7,755,115 B2 * | 7/2010 | Awano | .......... | 257/288 |
| 8,741,756 B2 * | 6/2014 | Franklin et al. | ............. | 438/589 |
| 8,786,018 B2 * | 7/2014 | Farmer et al. | ................ | 257/347 |
| 8,900,935 B2 * | 12/2014 | Guo | ..................... | H01L 21/845 257/24 |
| 2005/0274992 A1 * | 12/2005 | Appenzeller et al. | ........ | 257/288 |

* cited by examiner

*Primary Examiner* — Mark Prenty
(74) *Attorney, Agent, or Firm* — Innovation Counsel LLP

(57) ABSTRACT

A tunneling nanotube field effect transistor includes: an insulating layer disposed on a substrate; a gate electrode disposed on the insulating layer; a source electrode and a drain electrode disposed on the insulating layer on respective adjacent sides of the gate electrode; and a carbon nanotube extending through the gate electrode, wherein the carbon nanotube is supported by the source electrode, the gate electrode, and the drain electrode, wherein the carbon nanotube includes a first portion adjacent to the source electrode and a second portion adjacent to the drain electrode, and wherein the source electrode and the gate electrode are spaced apart by an exposed section of the first portion, and the drain electrode and the gate electrode are spaced apart by an exposed section of the second portion.

11 Claims, 7 Drawing Sheets

TUNNELING NANOTUBE FIELD EFFECT TRANSISTOR AND MANUFACTURING METHOD THEREOF

CROSS-REFERENCE TO RELATED APPLICATION

This application claims priority to Chinese Patent Application No. 201410185138.3 filed on May 5, 2014, the disclosure of which is incorporated herein by reference in its entirety.

BACKGROUND

Technical Field

The present disclosure relates to semiconductor technology and more particularly, to a tunneling nanotube field effect transistor and manufacturing method thereof.

Description of the Related Art

According to Moore's Law, VLSI (Very Large Scale Integration) circuit performance is improved and device cost is reduced as feature sizes in traditional MOSFETs (Metal Oxide Semiconductor Field Effect Transistors) continue to decrease. However, when device dimensions are reduced to sub-micron or nanometer scale (for example, below the 22 nm node), challenges in semiconductor device fabrication and performance arise. According to the 2009 International Technology Roadmap for Semiconductors (ITRS), these challenges include electron tunneling through the short channel and thin insulating film, which may cause current leakage, short channel effects, passive power consumption, as well as changes in the device structure and doping profile.

Some of the above challenges may be overcome by replacing the conventional MOSFET with carbon nanotube field effect transistors (CNTFETs). The use of CNTFETs can also help to further reduce device dimensions.

The prior art discloses a carbon nanotube field effect transistor having a planar structure. In the planar-type CNTFET, a gate is formed on a substrate and a carbon nanotube is formed above the gate. A source region and a drain region are formed on the substrate on the respective ends of the carbon nanotube.

The prior art also discloses a carbon nanotube field effect transistor having a wrap-around structure. In the wrap-around type CNTFET, a trench is formed on the substrate and a carbon nanotube is formed on the trench. A gate is formed surrounding the carbon nanotube in the trench. A source region and a drain region are formed on the substrate on the respective ends of the carbon nanotube.

However, both of the above prior art CNTFETs have high operating voltages which lead to high energy consumption, and are therefore not well-suited for CMOS technology and VLSI. For VLSI compatibility, a tunneling nanotube field effect transistor having an operating voltage of 0.1 V and a subthreshold oscillation characteristic of less than 60 mV/decade is preferred.

SUMMARY

The present disclosure addresses at least the above deficiencies in the prior art CNTFETs, by providing a tunneling nanotube field effect transistor having reduced operating voltage and that is compatible with CMOS technology and VLSI.

According to one embodiment of the inventive concept, a tunneling nanotube field effect transistor is provided. The tunneling nanotube field effect transistor includes: an insulating layer disposed on a substrate; a gate electrode disposed on the insulating layer; a source electrode and a drain electrode disposed on the insulating layer on respective adjacent sides of the gate electrode; and a carbon nanotube extending through the gate electrode, wherein the carbon nanotube is supported by the source electrode, the gate electrode, and the drain electrode, wherein the carbon nanotube includes a first portion adjacent to the source electrode and a second portion adjacent to the drain electrode, and wherein the source electrode and the gate electrode are spaced apart by an exposed section of the first portion, and the drain electrode and the gate electrode are spaced apart by an exposed section of the second portion.

In one embodiment, the carbon nanotube may have a diameter of about 1 nm to about 3 nm.

In one embodiment, the carbon nanotube may be supported by the source electrode, the gate electrode, and the drain electrode, such that a gap between the carbon nanotube and the insulating layer ranges from about 1 nm to about 7 nm.

In one embodiment, the source electrode, the gate electrode, and the drain electrode may have circular cross-sections supporting and surrounding the corresponding portions of the carbon nanotube.

In one embodiment, the exposed section of the first portion of the carbon nanotube may not be surrounded by the gate electrode and the source electrode, and the exposed section of the second portion of the carbon nanotube may not be surrounded by the gate electrode and the drain electrode.

In one embodiment, the first portion of the carbon nanotube may have a first conductivity type, and the second portion of the carbon nanotube may have a second conductivity type different from the first conductivity type.

In one embodiment, palladium (Pd) may be introduced onto the first portion of the carbon nanotube so that the first portion has the first conductivity type, and calcium (Ca) may be introduced onto the second portion of the carbon nanotube so that the second portion has the second conductivity type.

In one embodiment, the source electrode may be disposed on the first portion of the carbon nanotube, and the drain electrode may be disposed on the second portion of the carbon nanotube.

In one embodiment, the first portion of the carbon nanotube may serve as a source region, and the second portion of the carbon nanotube may serve as a drain region.

According to another embodiment of the inventive concept, a tunneling field effect transistor is provided. The tunneling field effect transistor includes: an insulating layer disposed on a substrate; a gate electrode disposed on the insulating layer; a source electrode and a drain electrode disposed on the insulating layer on respective adjacent sides of the gate electrode; and a carbon nanotube surrounded by the source electrode, the gate electrode, and the drain electrode, wherein a first portion of the carbon nanotube has a first conductivity type and serves as a source region, and a second portion of the carbon nanotube has a second conductivity type and serves as a drain region.

In one embodiment, the source electrode and the gate electrode may be spaced apart by an exposed section of the first portion of the carbon nanotube, and the drain electrode and the gate electrode may be spaced apart by an exposed section of the second portion of the carbon nanotube.

In one embodiment, the gate electrode, the source electrode, and the drain electrode may be disposed on the insulating layer.

According to a further embodiment of the inventive concept, a method of manufacturing a tunneling nanotube field effect transistor is provided. The method includes: forming an insulating layer on a substrate; forming a carbon nanotube above the insulating layer, wherein a portion of the carbon nanotube is supported and surrounded by a gate electrode; performing doping on the carbon nanotube such that a first portion of the carbon nanotube adjacent to the gate electrode has a first conductivity type and a second portion of the carbon nanotube adjacent to the gate electrode has a second conductivity type different from the first conductivity type; and forming a source electrode on the first portion and a drain electrode on the second portion, wherein the source electrode and the gate electrode are spaced apart by an exposed section of the first portion, and the drain electrode and the gate electrode are spaced apart by an exposed section of the second portion.

In one embodiment, forming the carbon nanotube above the insulating layer may further include: forming a porous silicon layer on the insulating layer; forming a photoresist layer having an opening on the porous silicon layer; applying a metal catalyst solution to the porous silicon layer through the opening; baking the metal catalyst solution and removing the photoresist layer; forming the carbon nanotube on the porous silicon layer through a chemical reaction between a metal catalyst in the metal catalyst solution and a carbon-based compound; removing a portion of the porous silicon layer beneath the carbon nanotube, such that the carbon nanotube is supported at its end portions by the remaining porous silicon layer; forming the gate electrode on the insulating layer, wherein the gate electrode surrounds the portion of the carbon nanotube; and removing the remaining porous silicon layer such that the carbon nanotube is supported by the gate electrode.

In one embodiment, performing doping on the carbon nanotube may further include: introducing palladium (Pd) onto the first portion of the carbon nanotube so that the first portion has the first conductivity type, and introducing calcium (Ca) onto the second portion of the carbon nanotube so that the second portion has the second conductivity type.

In one embodiment, the source electrode and the drain electrode may be formed using evaporation and lift-off processes.

In one embodiment, the first portion of the carbon nanotube having the first conductivity type may serve as a source region, and the second portion of the carbon nanotube having the second conductivity type may serve as a drain region.

In one embodiment, the source electrode and the drain electrode may surround the respective ends of the carbon nanotube.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
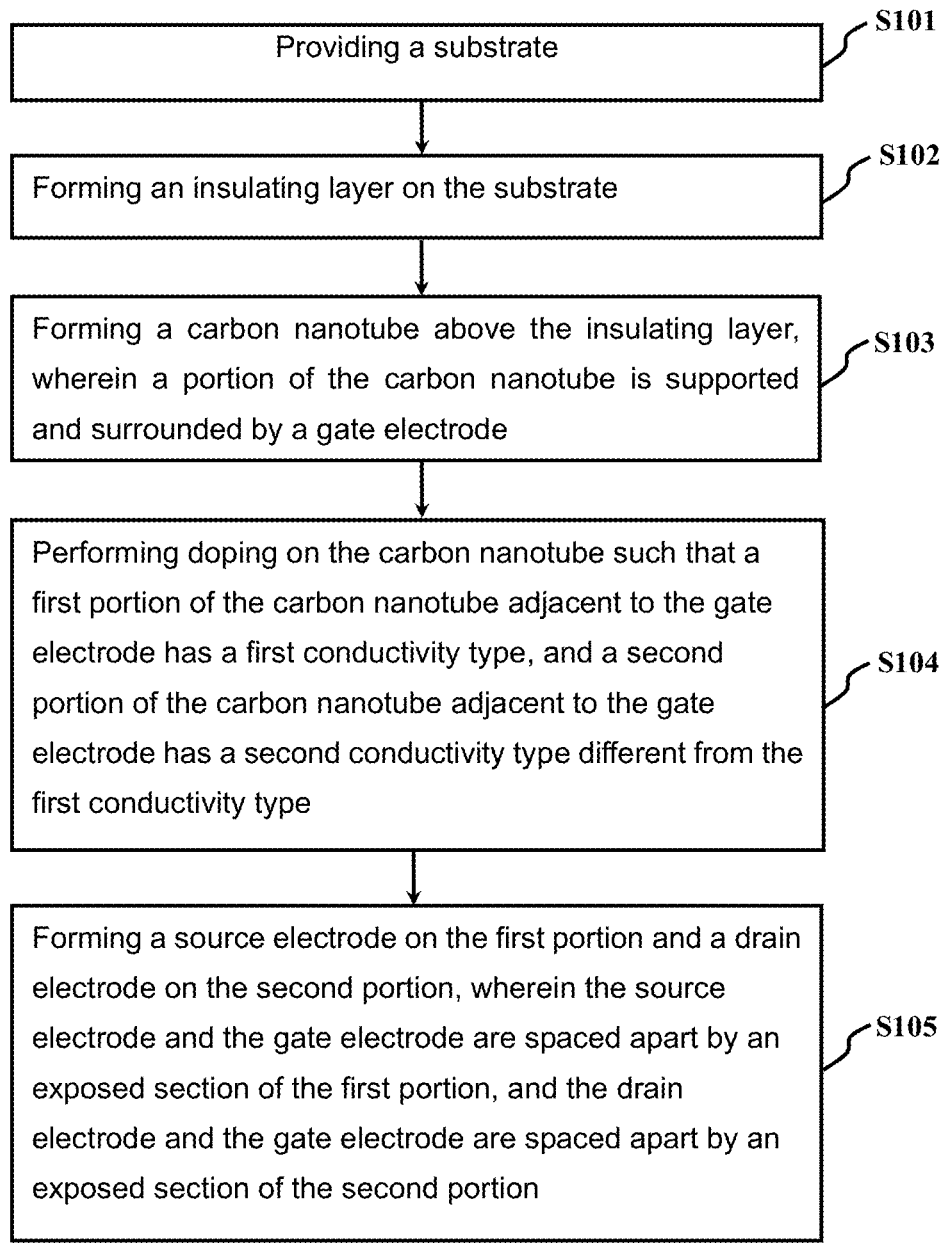
FIG. 1 is a flowchart illustrating a method of manufacturing a tunneling nanotube field effect transistor according to an embodiment of the inventive concept.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

It should be understood that the inventive concept is not limited to the embodiments described herein. Rather, the inventive concept may be modified in different ways to realize different embodiments.

Figure 11:
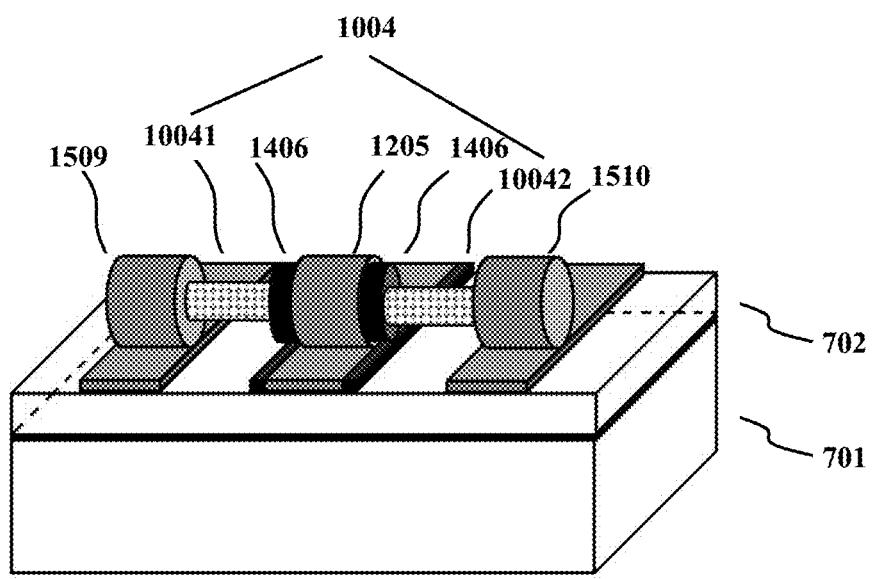
FIG. 11 is a schematic perspective view illustrating a source electrode and a drain electrode formed surrounding the respective ends of the carbon nanotube of FIG. 10.

Referring to FIG. 11, a tunneling nanotube field effect transistor according to an embodiment of the inventive concept includes a substrate 701 and an insulating layer 702 disposed on the substrate 701. The substrate 701 may be a silicon substrate. The insulating layer 702 may include silicon dioxide. A thickness of the insulating layer 702 may range from about 10 nm to about 100 nm. In a preferred embodiment, the thickness of the insulating layer 702 may be about 50 nm.

The tunneling nanotube field effect transistor also includes a gate electrode 1205, a source electrode 1509, and a drain electrode 1510 disposed on the insulating layer 702. The source electrode 1509 and the drain electrode 1510 are disposed on respective adjacent sides of the gate electrode 1205. The gate electrode 1205 may be a high-k metal gate.

The tunneling nanotube field effect transistor further includes a carbon nanotube 1004 surrounded by the gate electrode 1205. The carbon nanotube 1004 extends through and is supported by the source electrode 1509, gate electrode 1205, and drain electrode 1510. The carbon nanotube 1004 includes a first portion 10041 adjacent to the source electrode 1509 and a second portion 10042 adjacent to the drain electrode 1510.

The source electrode 1509 and the gate electrode 1205 are separated and spaced apart by an exposed section of the first portion 10041 of the carbon nanotube 1004. Similarly, the drain electrode 1510 and the gate electrode 1205 are separated and spaced apart by an exposed section of the second portion 10042 of the carbon nanotube 1004.

According to an embodiment of the inventive concept, at least one portion (e.g. the exposed section) of the first portion 10041 of the carbon nanotube 1004 is not surrounded by the gate electrode 1205 and the source electrode 1509, and at least one portion (e.g. the exposed section) of the second portion 10042 of the carbon nanotube 1004 is not surrounded by the gate electrode 1205 and the drain electrode 1510.

According to an embodiment of the inventive concept, the first portion 10041 of the carbon nanotube 1004 may serve as a source region having a first conductivity type, and the second portion 10042 of the carbon nanotube 1004 may serve as a drain region having a second conductivity type. The first conductivity type is different from the second conductivity type. For example, in one embodiment, the first portion 10041 of the carbon nanotube 1004 may be doped having a P-type conductivity and the second portion 10042 of the carbon nanotube 1004 may be doped having an N-type conductivity. The dopant concentration in the first portion 10041 of the carbon nanotube 1004 may be further increased to P+ and the dopant concentration in the second portion 10042 of the carbon nanotube 1004 may be further increased to N+, while the portion of the carbon nanotube 1004 surrounded by the gate electrode 1205 may be of an N-type conductivity.

In another alternative embodiment, the first portion 10041 of the carbon nanotube 1004 may be doped having an N-type conductivity and the second portion 10042 of the carbon nanotube 1004 may be doped having a P-type conductivity. The dopant concentration in the first portion 10041 of the carbon nanotube 1004 may be further increased to N+ and the dopant concentration in the second portion 10042 of the carbon nanotube 1004 may be further increased to P+, while the portion of the carbon nanotube 1004 surrounded by the gate electrode 1205 may be of a P-type conductivity.

After the source and drain regions have been formed on the carbon nanotube 1004, the source electrode 1509 and the drain electrode 1510 are formed on respective adjacent sides of the gate electrode 1205. Specifically, the source electrode 1509 and the drain electrode 1510 are formed at the respective ends of the carbon nanotube 1004.

In another embodiment of the inventive concept, a metal catalyst may be introduced onto the carbon nanotube 1004 to form regions of different conductivity types. For example, palladium (Pd) may be introduced onto the first portion 10041 of the carbon nanotube 1004 so that the first portion 10041 has a first conductivity type (e.g. P-type), and calcium (Ca) may be introduced onto the second portion 10042 of the carbon nanotube 1004 so that the second portion 10042 has a second conductivity type (e.g. N-type). The source electrode 1509 may be formed on the first portion 10041 of the carbon nanotube 1004 that had been exposed to Pd, and the drain electrode 1510 may be formed on the second portion 10042 of the carbon nanotube 1004 that had been exposed to Ca. Accordingly, source and drain regions of different conductivity types can be formed on the carbon nanotube 1004 by introducing different metal catalysts (e.g., Pd, Ca) onto different portions of the carbon nanotube 1004, and subsequently source and drain electrodes may be formed on the respective source and drain regions.

In an embodiment in which the first portion of the carbon nanotube is P-type and the second portion of the carbon nanotube is N-type and a positive voltage is applied to the drain electrode, no tunneling effect occurs if the gate voltage is zero. However, when a positive voltage is applied to the gate such that the gate voltage exceeds a threshold voltage, electrons can tunnel from the source electrode across the carbon nanotube to the drain electrode, thereby allowing conduction between the source and drain electrodes.

In another embodiment in which the first portion of the carbon nanotube is N-type and the second portion of the carbon nanotube is P-type and a negative voltage is applied to the drain electrode, no tunneling effect occurs if the gate voltage is zero. However, when a negative voltage is applied to the gate such that the gate voltage exceeds a threshold voltage, electrons can tunnel from the drain electrode across the carbon nanotube to the source electrode, thereby allowing conduction between the source and drain electrodes.

The tunneling nanotube field effect transistor according to the above embodiments has lower operating voltage and is compatible with CMOS and VLSI technology, and can therefore be used to improve device performance.

According to another embodiment of the inventive concept, the tunneling nanotube field effect transistor may further include a spacer 1406 formed above the insulating layer 702. Specifically, the spacer 1406 is formed on both sides of the gate electrode 1205 and surrounds at least a portion of the carbon nanotube 1004.

According to an embodiment of the inventive concept, the carbon nanotube 1004 may have a diameter of about 1 nm to about 3 nm. The carbon nanotube 1004 is supported by the source electrode 1509, the gate electrode 1205, and the drain electrode 1510, such that a gap between the carbon nanotube 1004 and the insulating layer 702 ranges from about 1 nm to about 7 nm. It should be noted that the above dimensions are merely exemplary and that the scope of the inventive concept is not limited thereto.

According to an embodiment of the inventive concept, the source electrode 1509, gate electrode 1205, and drain electrode 1510 have circular cross-sections surrounding the corresponding portions of the carbon nanotube 1004. Those skilled in the art will understand that the shapes of the source electrode 1509, gate electrode 1205, and drain electrode 1510 are merely exemplary, and that the scope of the inventive concept is not limited thereto.

Next, a method of manufacturing an exemplary tunneling nanotube field effect transistor will be described with reference to FIG. 1. Specifically, FIG. 1 is a flowchart illustrating a method of manufacturing a tunneling nanotube field effect transistor according to an embodiment of the inventive concept.

First, in step S101, a substrate 701 is provided. The substrate 701 may be a silicon substrate.

Figure 3:
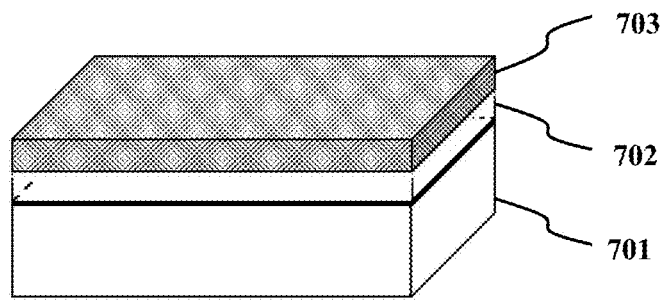
FIG. 3 is a schematic perspective view illustrating a porous silicon layer formed on a substrate.

Next, in step S102, an insulating layer 702 is formed on the substrate 701, as shown in FIG. 3. The insulating layer 702 may include silicon dioxide. The insulating layer 702 may be formed having a thickness ranging from about 10 nm to about 100 nm. In a preferred embodiment, the thickness of the insulating layer 702 may be about 50 nm.

Figure 9:
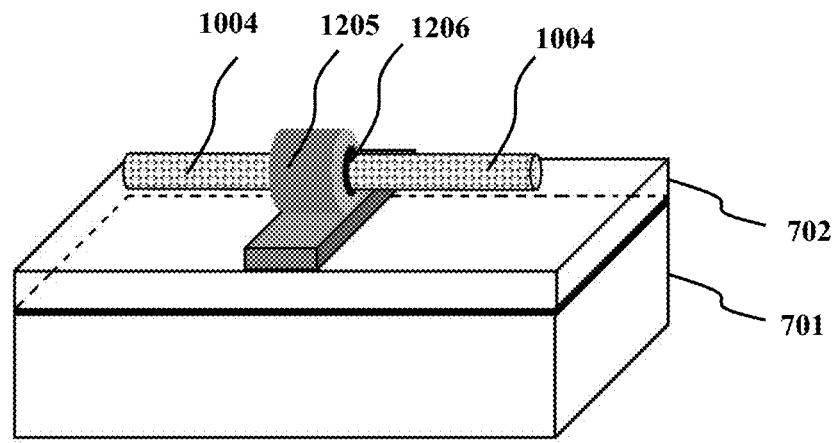
FIG. 9 is a schematic perspective view illustrating the end portions of the porous silicon layer of FIG. 8 being removed.

Next, in step S103, a carbon nanotube 1004 is formed above the insulating layer 702, as shown in FIG. 9. The carbon nanotube 1004 is supported and surrounded at its center by a gate electrode 1205.

Figure 10:
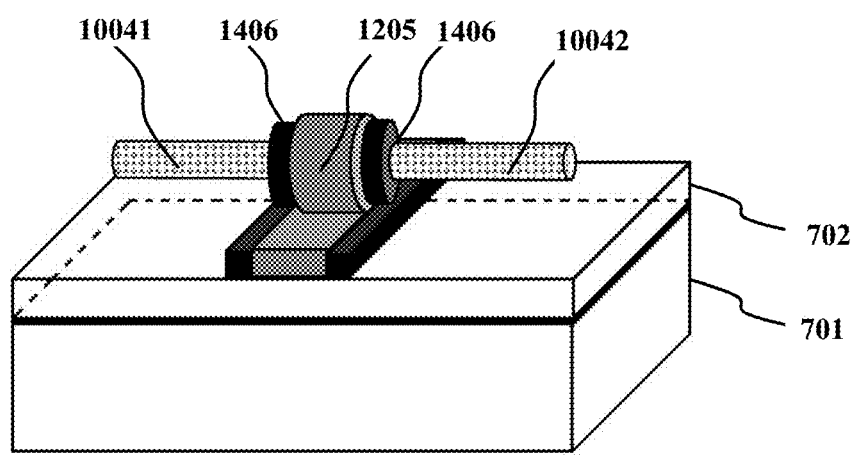
FIG. 10 is a schematic perspective view illustrating a spacer formed on both side portions of the gate electrode of FIG. 9.

Next, in step S104, the carbon nanotube 1004 is doped such that a first portion 10041 has a first conductivity type and a second portion 10042 has a second conductivity type, as shown in FIG. 10.

Next, in step S105, the source electrode 1509 and the drain electrode 1510 are formed at the respective ends of the carbon nanotube 1004 such that the source electrode 1509 and the drain electrode 1510 are spaced apart from the gate electrode 1205, as shown in FIG. 11.

Figure 2:
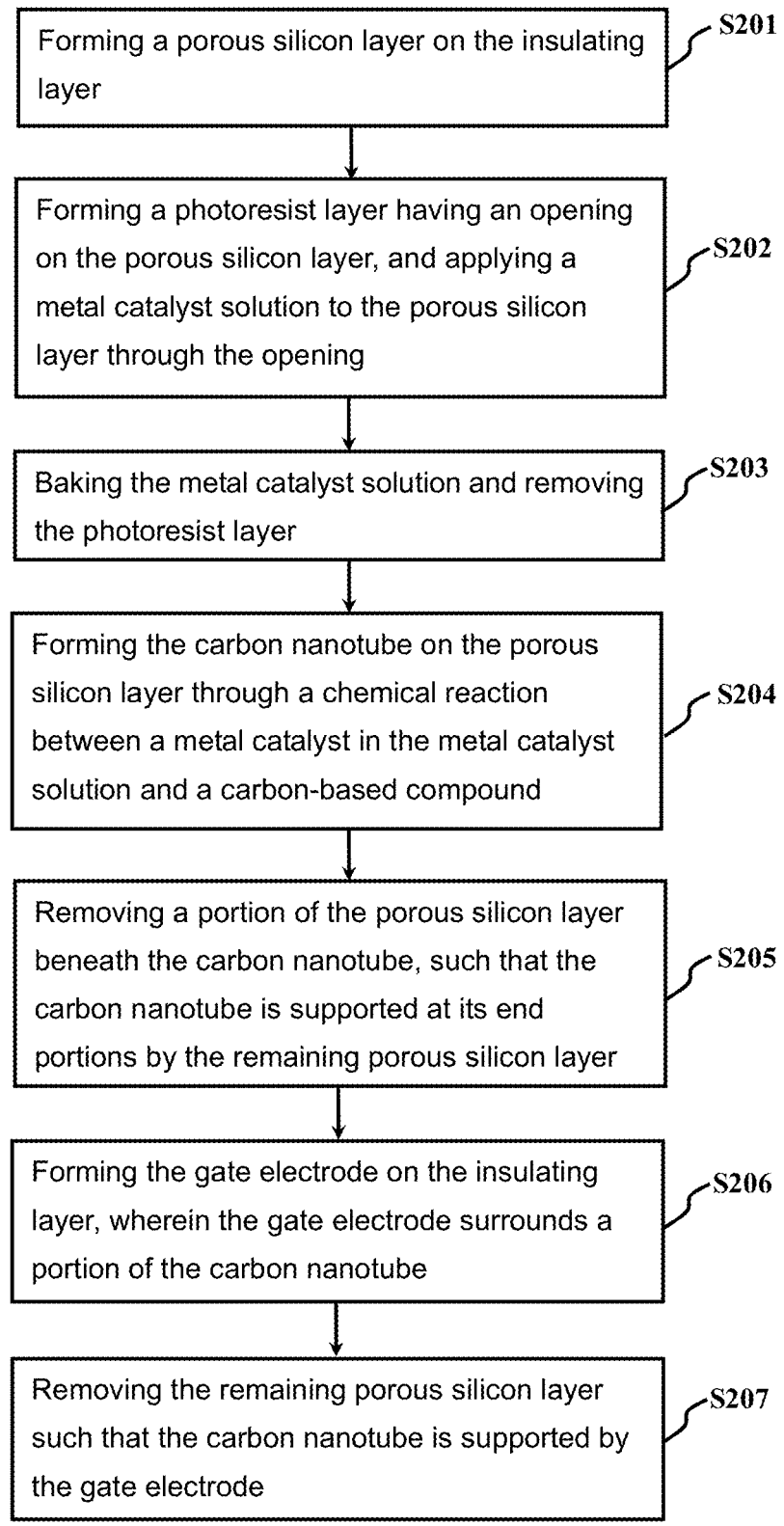
FIG. 2 is a flowchart illustrating process step S103 of FIG. 1 in further detail.

FIG. 2 is a flowchart illustrating process step S103 of FIG. 1 in further detail.

In step S201, a porous silicon layer 703 is formed on the insulating layer 702, as illustrated in FIG. 3. For example, forming the porous silicon layer 703 may include forming a heavily-doped polysilicon layer on the insulating layer 702 and performing electrolytic etching on the heavily-doped polysilicon layer to form the porous silicon layer 703. A thickness of the porous silicon layer 703 may range from about 2 nm to about 10 nm. In a preferred embodiment, the thickness of the porous silicon layer 703 may be about 5 nm.

Next, in step S202, a photoresist layer 804 having an opening 805 is formed on the porous silicon layer 703, and a metal catalyst solution is applied to the porous silicon layer 703 through the opening 805. For example, referring to FIG. 4, the photoresist layer 804 is first formed on the porous silicon layer 703. Next, the opening 805 is formed in the photoresist layer 804 via photolithography. Specifically, the opening 805 is formed in a region where the carbon nanotube 1004 is to be formed, so as to expose the porous silicon layer 703 in the region. Lastly, the metal catalyst solution is applied onto the exposed area of the porous silicon layer 703 through the opening 805 of the photoresist layer 804. The metal catalyst may, for example, include at least one of platinum, gold, silver, copper, and nickel.

Figure 4:
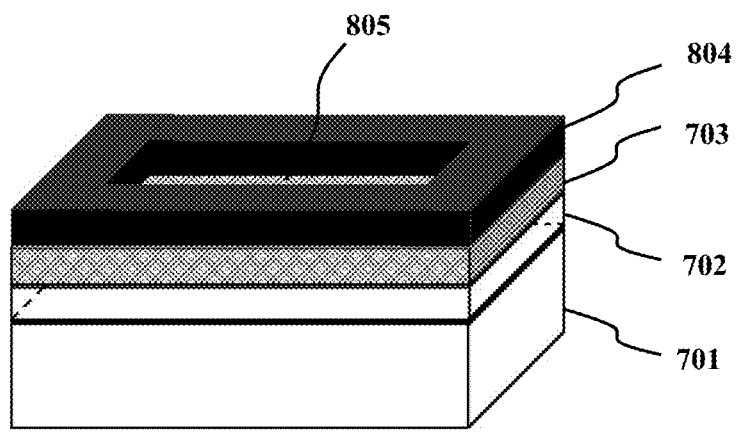
FIG. 4 is a schematic perspective view illustrating a photoresist structure formed on the porous silicon layer of FIG. 3.

Referring to FIG. 4, the opening 805 corresponds to a region where the carbon nanotube 1004 is to be formed. Accordingly, a portion of the photoresist layer 804 may be removed to form the opening 805, so as to expose the underlying porous silicon layer 703. Although the opening 805 is shown having a rectangular shape, those skilled in the art would recognize that the opening 805 is not limited to a rectangular shape, but may also be formed in other shapes (for example, an oval shape). In some embodiments, more than one opening 805 may be formed (for example, a plurality of openings 805 may be formed). In some embodiments, the opening 805 need not be centrally located with respect to the porous silicon layer 703, and can be disposed in locations that are away from the center of the porous silicon layer 703.

Next, in step S203, the metal catalyst solution is baked and the photoresist layer 804 is then removed.

Figure 5:
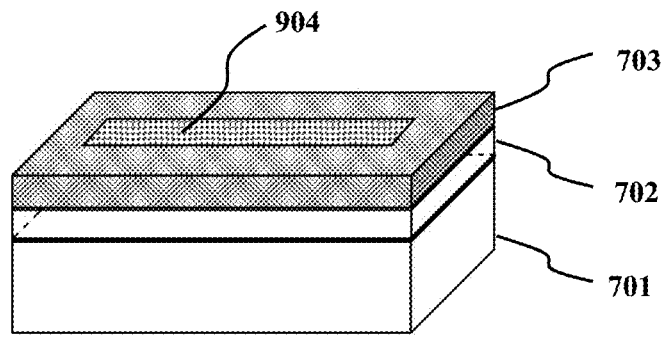
FIG. 5 is a schematic perspective view illustrating metal nanoparticles formed in the porous silicon layer of FIG. 4.

For example, referring to FIG. 5, after the metal catalyst solution is applied onto the exposed porous silicon layer 703 through the opening 805, the solution is then baked in a nitrogen or hydrogen containing atmosphere to evaporate the solution, in the process forming metal nanoparticles. The diameter of the metal nanoparticles may be, for example, about 3 nm or less. The metal nanoparticles serve as a metal catalyst for forming the carbon nanotube, as described in more detail later in the specification.

After the metal catalyst solution is baked, the remaining photoresist layer 804 on the porous silicon layer 703 is completely removed to produce the structure illustrated in FIG. 5. As shown in FIG. 5, the structure comprises a metal nanoparticles layer 904 formed on a central region of the porous silicon layer 703, with the photoresist layer 804 completely removed from the porous silicon layer 703.

Figure 6:
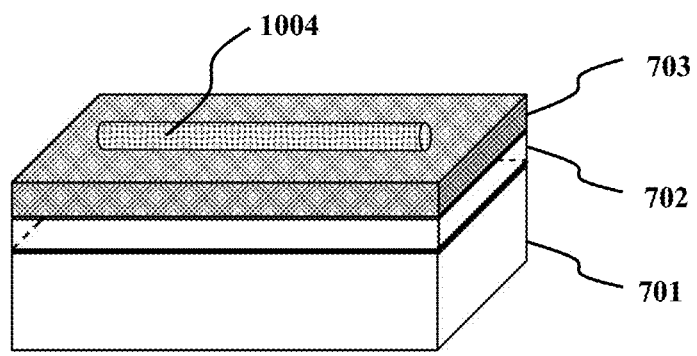
FIG. 6 is a schematic perspective view illustrating a carbon nanotube formed on the porous silicon layer of FIG. 5.

Next, in step S204, the carbon nanotube 1004 is formed on the porous silicon layer 703 through a chemical reaction. For example, referring to FIG. 6, the carbon nanotube 1004 can be formed on the surface of the porous silicon layer 703 by reacting the metal catalyst (i.e. metal nanoparticles layer 904) with a carbon-based compound (e.g. a carbonyl compound). Various techniques can be used to create the reaction between the metal catalyst and the carbon-based compound to form the carbon nanotube 1004. In one embodiment, when forming the carbon nanotube 1004 using a chemical vapor deposition (CVD) technique, the metal catalyst reacts with the carbon-based compound at a temperature of about 800° C. to about 1000° C. in the CVD chamber to form the carbon nanotube 1004. Those skilled in the art would understand that the above-described technique is merely exemplary, and that other methods can be used to create the reaction between the metal catalyst and the carbon-based compound to form the carbon nanotube 1004.

The carbon-based compound may include, for example, at least one of methane, ethylene, acetylene, carbon monoxide, and benzene. Those skilled in the art would recognize that other types of carbon-based compounds may be used, as long as those other types of carbon-based compounds can react with the metal catalyst to form carbon nanotubes.

In a preferred embodiment, the carbon nanotube 1004 may be a single-walled carbon nanotube. Any metal particle with a diameter less than about 3 nm can be used to produce single-wall carbon nanotubes. A typical single-walled carbon nanotube may have a diameter ranging from about 1 nm to about 3 nm. The metal particles may include copper, gold, silver, iron, or other precious metals.

Figure 7:
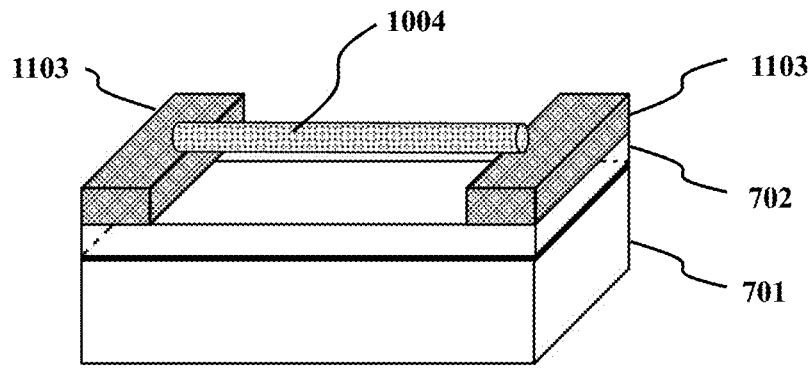
FIG. 7 is a schematic perspective view illustrating a portion of the porous silicon layer of FIG. 6 being removed.

Next, in step S205, a portion of the porous silicon layer 703 beneath the carbon nanotube 1004 is removed, such that the carbon nanotube 1004 is supported at its end portions by the remaining porous silicon layer. For example, referring to FIG. 7, photolithography is performed on the porous silicon layer 703, so as to remove the portion of the porous silicon layer 703 beneath the carbon nanotube 1004. However, the portion of the porous silicon layer 703 located at the two ends of the carbon nanotube 1004 is not removed by the photolithography, as depicted by the remaining porous silicon layer 1103. As shown in FIG. 7, the two ends of the carbon nanotube 1004 are supported by the remaining porous silicon layer 1103. Those skilled in the art would recognize that different portions of the porous silicon layer 703 may be removed in different configurations depending on device and structural needs, as long as the remaining porous silicon layer 1103 is capable of supporting the carbon nanotube 1004.

Next, in step S206, the gate electrode 1205 is formed on the insulating layer 702. Specifically, the gate electrode 1205 is formed surrounding a center portion of the carbon nanotube 1004.

Figure 8:
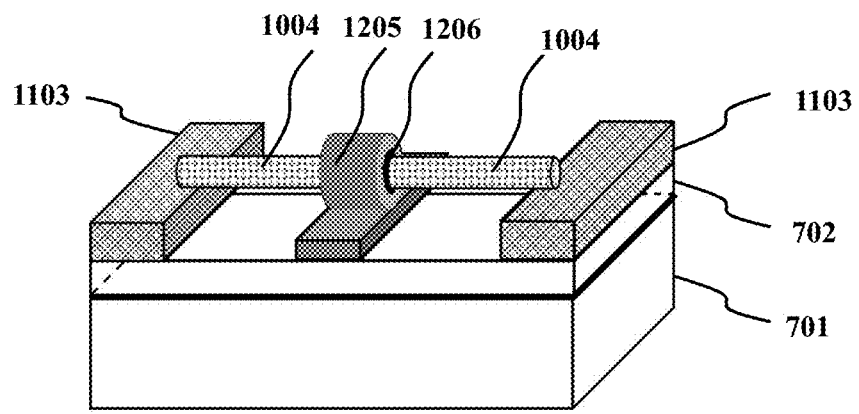
FIG. 8 is a schematic perspective view illustrating a gate electrode formed surrounding a center portion of the carbon nanotube.

In a preferred embodiment, a high-K dielectric layer may be formed between the carbon nanotube 1004 and the gate electrode 1205 surrounding the center portion of the carbon nanotube 1004. For example, referring to FIG. 8, a high-K dielectric layer 1206 may be formed between the carbon nanotube 1004 and the gate electrode 1205 surrounding the center portion of the carbon nanotube 1004. Specifically, a high-K dielectric layer is first formed completely surrounding the carbon nanotube 1004, and photolithography is then performed to remove the portions of the high-K dielectric layer that are located outside of the center portion of the carbon nanotube 1004. Accordingly, the high-K dielectric layer 1206 is left remaining on (and surrounding) the center portion of the carbon nanotube 1004.

Next, the gate electrode 1205 is formed surrounding the high-K dielectric layer 1206. As previously mentioned, the gate electrode 1205 is formed surrounding the center portion of the carbon nanotube 1004. By forming the gate electrode 1205 such that it is wrapped around the center portion of the carbon nanotube 1004, the control of the gate electrode 1205 over the channel of the carbon nanotube 1004 can be improved, thereby reducing the electron barrier between the source electrode 1509 and the drain electrode 1510.

Next, in step S207, the remaining porous silicon layer 1103 is removed such that the carbon nanotube 1004 is supported by the gate electrode 1205. For example, referring to FIG. 9, after the remaining porous silicon layer 1103 at the two ends of the carbon nanotube 1004 is removed, the carbon nanotube 1004 will be supported by the gate electrode 1205 at its center portion.

Accordingly, using the steps described above in S201 to S207, a carbon nanotube can be formed on the substrate above the insulating layer, whereby the carbon nanotube is surrounded and supported at its center by the gate electrode.

Referring back to step S104 of FIG. 1, the carbon nanotube 1004 undergoes doping such that the first portion 10041 and second portion 10042 adjacent to the gate electrode 1205 are doped having different conductivity types. Next, the source electrode 1509 and drain electrode 1510 are formed surrounding the respective ends of the carbon nanotube 1004. The source electrode 1509 and the drain electrode 1510 may be formed using evaporation and lift-off processes. As shown in FIG. 11, the source electrode 1509 is spaced apart from the gate electrode 1205 by an exposed section of the first portion 10041 of the carbon nanotube 1004, and the drain electrode 1510 is spaced apart from the gate electrode 1205 by an exposed section of the second portion 10042 of the carbon nanotube 1004.

According to an embodiment of the inventive concept, a metal catalyst may be introduced onto the carbon nanotube 1004 to form regions of different conductivity types. For example, palladium (Pd) may be introduced onto the first portion 10041 of the carbon nanotube 1004 so that the first portion 10041 has a first conductivity type (e.g. P-type), and calcium (Ca) may be introduced onto the second portion 10042 of the carbon nanotube 1004 so that the second portion 10042 has a second conductivity type (e.g. N-type). The source electrode 1509 may be formed on the first portion 10041 of the carbon nanotube 1004 that had been exposed to Pd, and the drain electrode 1510 may be formed on the second portion 10042 of the carbon nanotube 1004 that had been exposed to Ca.

Those skilled in the art will appreciate that the positions of the source electrode and the drain electrode are interchangeable, the materials for forming the source electrode and the drain electrode are merely exemplary, and the scope of the inventive concept is not limited thereto.

In some embodiments, a spacer (e.g. spacer 1406) may be formed on both sides of the gate electrode 1205.

Embodiments of a tunneling nanotube field effect transistor and a method of manufacturing the tunneling nanotube field effect transistor have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A tunneling nanotube field effect transistor comprising:
an insulating layer disposed on a substrate;
a gate electrode disposed on the insulating layer;
a source electrode and a drain electrode disposed on the insulating layer on respective adjacent sides of the gate electrode;
a carbon nanotube extending through the gate electrode, wherein a gap between the carbon nanotube and the insulating layer ranges from about 1 nm to about 7 nm; and
a spacer disposed on the insulating layer on both sides of the gate electrode and surrounding the carbon nanotube,
wherein the carbon nanotube is supported by the source electrode, the gate electrode, and the drain electrode,
wherein the carbon nanotube includes a first portion adjacent to the source electrode and a second portion adjacent to the drain electrode,
wherein the source electrode and the gate electrode are spaced apart by an exposed section of the first portion, and the drain electrode and the gate electrode are spaced apart by an exposed section of the second portion, and
wherein a direction of electron tunneling across the carbon nanotube between the source electrode and the drain electrode is determined by a voltage applied to the gate electrode and conductivity types of the first portion and second portion of the carbon nanotube.

2. The tunneling nanotube field effect transistor according to claim 1, wherein the carbon nanotube has a diameter of about 1 nm to about 3 nm.

3. The tunneling nanotube field effect transistor according to claim 1, wherein the source electrode, the gate electrode, and the drain electrode have circular cross-sections supporting and surrounding the corresponding portions of the carbon nanotube.

4. The tunneling nanotube field effect transistor according to claim 3, wherein the exposed section of the first portion of the carbon nanotube is not surrounded by the gate electrode and the source electrode, and the exposed section of the second portion of the carbon nanotube is not surrounded by the gate electrode and the drain electrode.

5. The tunneling nanotube field effect transistor according to claim 1, wherein the first portion of the carbon nanotube has a first conductivity type, and the second portion of the carbon nanotube has a second conductivity type different from the first conductivity type.

6. The tunneling nanotube field effect transistor according to claim 5, wherein palladium (Pd) is introduced onto the first portion of the carbon nanotube so that the first portion has the first conductivity type, and calcium (Ca) is introduced onto the second portion of the carbon nanotube so that the second portion has the second conductivity type.

7. The tunneling nanotube field effect transistor according to claim 6, wherein the source electrode is disposed on the first portion of the carbon nanotube, and the drain electrode is disposed on the second portion of the carbon nanotube.

8. The tunneling nanotube field effect transistor according to claim 6, wherein the first portion of the carbon nanotube serves as a source region, and the second portion of the carbon nanotube serves as a drain region.

9. A tunneling field effect transistor comprising:
an insulating layer disposed on a substrate;
a gate electrode disposed on the insulating layer;
a source electrode and a drain electrode disposed on the insulating layer on respective adjacent sides of the gate electrode;
a carbon nanotube surrounded by the source electrode, the gate electrode, and the drain electrode, wherein a gap between the carbon nanotube and the insulating layer ranges from about 1 nm to about 7 nm; and
a spacer disposed on the insulating layer on both sides of the gate electrode and surrounding the carbon nanotube,
wherein a first portion of the carbon nanotube has a first conductivity type and serves as a source region, and a second portion of the carbon nanotube has a second conductivity type and serves as a drain region.

10. The tunneling field effect transistor according to claim 9, wherein the source electrode and the gate electrode are spaced apart by an exposed section of the first portion of the carbon nanotube, and the drain electrode and the gate electrode are spaced apart by an exposed section of the second portion of the carbon nanotube.

11. The tunneling field effect transistor according to claim 9, wherein the gate electrode, the source electrode, and the drain electrode are disposed on the insulating layer.

\* \* \* \* \*